(12) United States Patent
Reiber

(10) Patent No.: US 7,389,905 B2
(45) Date of Patent: *Jun. 24, 2008

(54) FLIP CHIP BONDING TOOL TIP

(76) Inventor: Steven F. Reiber, 4409 Vivien Way, Rocklin, CA (US) 95677

( * ) Notice: Subject to any disclaimer, the term of this patent is extended or adjusted under 35 U.S.C. 154(b) by 56 days.

This patent is subject to a terminal disclaimer.

(21) Appl. No.: 10/942,311

(22) Filed: Sep. 15, 2004

(65) Prior Publication Data

US 2005/0109817 A1    May 26, 2005

Related U.S. Application Data

(63) Continuation-in-part of application No. 10/650,169, filed on Aug. 27, 2003, now Pat. No. 6,935,548, which is a continuation of application No. 10/036,579, filed on Dec. 31, 2001, now Pat. No. 6,651,864, and a continuation-in-part of application No. 09/514,454, filed on Feb. 25, 2000, now Pat. No. 6,354,479.

(60) Provisional application No. 60/503,267, filed on Sep. 15, 2003, provisional application No. 60/288,203, filed on May 1, 2001, provisional application No. 60/121,694, filed on Feb. 25, 1999.

(51) Int. Cl.
*B23K 31/02* (2006.01)
*B23K 37/00* (2006.01)
*B22F 1/00* (2006.01)

(52) U.S. Cl. ............ 228/179.1; 228/4.1; 419/38
(58) Field of Classification Search ............... None
See application file for complete search history.

(56) References Cited

U.S. PATENT DOCUMENTS

| | | |
|---|---|---|
| 2,892,924 A | 6/1959 | Wood |
| 3,538,205 A | 11/1970 | Gates, Jr. et al. |
| 3,563,443 A | 2/1971 | Perdotti et al. |
| 3,660,050 A | 5/1972 | Iler et al. |
| 3,917,148 A | 11/1975 | Runyon |
| 3,938,722 A | 2/1976 | Kelly et al. |
| 3,971,499 A | 7/1976 | Goodrich, Jr. et al. |
| 3,986,255 A | 10/1976 | Mandal |
| 3,986,653 A | 10/1976 | Gilding |
| 4,020,543 A | 5/1977 | Pennings |
| 4,050,762 A | 9/1977 | Hines et al. |

(Continued)

FOREIGN PATENT DOCUMENTS

EP        0435423        7/1991

(Continued)

OTHER PUBLICATIONS

Translation of JP-05226421A.*

(Continued)

*Primary Examiner*—Kiley Stoner
(74) *Attorney, Agent, or Firm*—Carr & Ferrell LLP

(57) ABSTRACT

A flip chip bonding tool tip comprising a dissipative material with a resistance low enough to prevent a discharge of a charge to a device being bonded and high enough to avoid current flow large enough to damage the device being bonded is disclosed. Methods for manufacturing a dissipative material for use in a flip chip bonding tool tip are further disclosed.

59 Claims, 5 Drawing Sheets

U.S. PATENT DOCUMENTS

| | | | |
|---|---|---|---|
| 4,157,932 A | 6/1979 | Hirata | |
| 4,171,477 A | 10/1979 | Funari | |
| 4,182,947 A | 1/1980 | Brower | |
| 4,315,128 A | 2/1982 | Matcovich et al. | |
| 4,331,048 A | 5/1982 | Dworak et al. | |
| 4,387,283 A | 6/1983 | Peterson et al. | |
| 4,390,771 A | 6/1983 | Kurtz et al. | |
| 4,405,074 A | 9/1983 | Levintov et al. | |
| 4,502,983 A | 3/1985 | Omori et al. | |
| 4,513,190 A | 4/1985 | Ellett et al. | |
| 4,551,912 A | 11/1985 | Marks et al. | |
| 4,554,033 A | 11/1985 | Dery et al. | |
| 4,555,052 A | 11/1985 | Kurtz et al. | |
| 4,686,465 A | 8/1987 | Kruger | |
| 4,691,854 A | 9/1987 | Haefling et al. | |
| 4,705,204 A | 11/1987 | Hirota et al. | |
| 4,772,498 A | 9/1988 | Bertin et al. | |
| 4,776,509 A | 10/1988 | Pitts et al. | |
| 4,821,944 A | 4/1989 | Tsumura | |
| 4,821,945 A | 4/1989 | Chase et al. | |
| 4,842,662 A | 6/1989 | Jacobi | |
| 4,897,710 A | 1/1990 | Suzuki et al. | |
| 4,899,921 A | 2/1990 | Bendat et al. | |
| 4,909,427 A | 3/1990 | Plaisted et al. | |
| 4,974,767 A | 12/1990 | Alfaro et al. | |
| 4,998,002 A | 3/1991 | Okikawa et al. | |
| 5,123,935 A | 6/1992 | Kanamaru et al. | |
| 5,144,747 A | 9/1992 | Eichelberger | |
| 5,178,742 A | 1/1993 | Lemke et al. | |
| 5,180,093 A | 1/1993 | Stansbury et al. | |
| 5,214,259 A | 5/1993 | Terakado et al. | |
| 5,217,154 A | 6/1993 | Elwood et al. | |
| 5,250,843 A | 10/1993 | Eichelberger | |
| 5,280,979 A | 1/1994 | Poli et al. | |
| 5,290,507 A | 3/1994 | Runkle | |
| 5,341,979 A | 8/1994 | Gupta | |
| 5,347,086 A | 9/1994 | Potter et al. | |
| 5,367,956 A | 11/1994 | Fogle, Jr. | |
| 5,421,503 A | 6/1995 | Perlberg et al. | |
| 5,427,301 A | 6/1995 | Pham et al. | |
| 5,437,405 A | 8/1995 | Asanassivest | |
| 5,463,197 A | 10/1995 | Miyazaki | |
| 5,491,605 A | 2/1996 | Hughbanks et al. | |
| 5,516,027 A * | 5/1996 | Tanabe et al. | 228/44.7 |
| 5,527,441 A | 6/1996 | Offer | |
| 5,544,804 A | 8/1996 | Test et al. | |
| 5,558,270 A | 9/1996 | Nachon et al. | |
| 5,601,740 A | 2/1997 | Eldridge et al. | |
| 5,616,257 A | 4/1997 | Harada et al. | |
| 5,649,355 A | 7/1997 | Offer | |
| 5,651,901 A | 7/1997 | Mohri et al. | |
| 5,662,261 A | 9/1997 | Fogal | |
| 5,669,545 A * | 9/1997 | Pham et al. | 228/1.1 |
| 5,676,856 A | 10/1997 | Haji et al. | |
| 5,797,388 A | 8/1998 | Nakamura et al. | |
| 5,816,472 A | 10/1998 | Linn | |
| 5,827,470 A | 10/1998 | Chatterjee et al. | |
| 5,871,141 A | 2/1999 | Hadar et al. | |
| 5,931,368 A | 8/1999 | Hadar et al. | |
| 5,984,162 A | 11/1999 | Hortaleza et al. | |
| 6,030,472 A | 2/2000 | Hajaligol et al. | |
| 6,041,995 A | 3/2000 | Takahashi et al. | |
| 6,053,777 A | 4/2000 | Boyle | |
| 6,073,827 A | 6/2000 | Razon et al. | |
| 6,219,911 B1 | 4/2001 | Estes et al. | |
| 6,270,898 B1 * | 8/2001 | Yamamoto et al. | 428/408 |
| 6,337,522 B1 | 1/2002 | Kang et al. | |
| 6,354,479 B1 * | 3/2002 | Reiber et al. | 228/4.5 |
| 6,646,355 B2 | 11/2003 | Kang et al. | |
| 6,651,864 B2 * | 11/2003 | Reiber et al. | 228/4.5 |
| 6,759,642 B2 | 7/2004 | Hoshino | |
| 6,905,350 B1 | 6/2005 | Wallash et al. | |
| 6,935,548 B2 * | 8/2005 | Reiber et al. | 228/4.5 |
| 7,032,802 B2 | 4/2006 | Reiber | |
| 7,124,927 B2 | 10/2006 | Reiber | |
| 2005/0109814 A1 | 5/2005 | Reiber | |
| 2005/0109817 A1 | 5/2005 | Reiber | |
| 2005/0242155 A1 | 11/2005 | Reiber | |
| 2006/0261132 A1 | 11/2006 | Reiber | |
| 2007/0085085 A1 | 4/2007 | Reiber | |

FOREIGN PATENT DOCUMENTS

| | | |
|---|---|---|
| GB | 2287897 | 10/1995 |
| JP | 53087166 A * | 8/1978 |
| JP | 54037114 | 3/1979 |
| JP | 63164228 | 7/1988 |
| JP | 63-239959 | 10/1988 |
| JP | 02-67741 | 3/1990 |
| JP | 04-149065 | 5/1992 |
| JP | 05226421 A * | 9/1993 |
| JP | 06-45389 | 2/1994 |
| JP | 09-162223 | 6/1997 |
| JP | 11-186315 | 7/1999 |
| JP | 11-251357 | 9/1999 |
| JP | 2001-351934 | 1/2001 |
| JP | 2001-201515 | 7/2001 |

OTHER PUBLICATIONS

Stan Weitz, "Trends in ESD Test Methods," Materials Testing Section of the ETS Testing Laboratory, Electrotech Systems, 1998, pp. 1-7.

Instrument FAQs, Drivers, Libraries and Examples, Keithley Instrument Model 6517/6517A, Keithley Instruments, Inc., 1999, pp. 1-2.

Keithley Instruments Model 6517A Electrometer/High Resistance Meter, Keithley Instruments, Inc., pp. 1-9, date unknown.

"Low-Current/High-Resistance Meters," Keithley Instruments Model 6517A, Keithley Instruments, Inc. pp. 112-115, date unknown.

Keytech 200 XV-2 ESD Simulator, Kandus Equipment, p. 1, date unknown.

Newburg, Carl E., "Test Report", Anza Technology, Incorporated Static Dissipative Ceramic Rods . . . , Report 190:2000-92, River's Edge Technical Service, Nov. 29, 2000, pp. 1-5.

Huntsman, James et al., "Test Methods for Static Control Products," Electrical Overstress/Electrostatic Discharge Sym., Sep. 21, 1982, pp. 94-109, vl.4, IIT Rsrch Inst.

U.S. Appl. No. 11/406,504, Unpublished, Reiber.

U.S. Appl. No. 11/463,285, Unpublished, Reiber.

Gaiser Tool Co., "Single Point Automated Bonding (T.A.B.)," Available at http://www.gaisertool.com/products/other/sptab-1.pdf (last modified Aug. 22, 2005).

Gaiser Tool Co., "Single Point Automated Bonding (T.A.B.)," Available at http://www.gaisertool.com/products/other/sptab-2.pdf (last modified Aug. 22, 2005).

Siliconfareast.com, "Tape Automated Bonding (TAB)," http://www.siliconfareast.com/tab.htm,(c) 2004.

Klossner, et al., "An Integrated Approach to Solving sub-45um Wire Bond Process Challenges," SEMICON Singapore, 2001.

Wilson, et al. "Holographic Interferometry Applied to Motion Studies of Ultrasonic Bonders," IEEE Transactions on Sonics and Ultrasonics, vol. 19, No. 4, Oct. 1972.

Olney et al., "A New ESD Model: The Charged Strip Model," EOS/ESD Symposium Proceedings, 2002.

Andres et al., "Bumping Wafers via Ultrasonically Enhanced Stencil Printing," SEMICON West 2003.

Jittinorasett, Suwanna, "UBM Formation on Single Die/Dice for Flip Chip Applications," Aug. 1999.

Zakel, et al., "Laser Solder Attach for Optoelectronic Packages," Proceedings of the PhoPack Conference (Stanford University, California), Jul. 2002.

PacTech Packaging Technologies, "Laser Solder Ball Jet System," www.pactech-usa.com (date unknown).

Mayer, Michael et al., "Active Test Chips for In Situ Wire Bonding Process Characterization," Semicon Singapore 2001, May 2001.

National Semiconductor, "Semiconductor Packaging Assembly Technology," Aug. 1999.

Suman et al., "Wire Bond Temperature Sensor," IMAPS International Symposium on Microelectronics, Baltimore, MD, Oct. 9-11, 2001.

"In the Matter of Certain Hard Disk Drives, Components Thereof, and Products Containing the Same; Notice of Investigation," International Trade Commission, Inv. No. 337-TA-616, Fedral Register, vol. 72 No. 198, Oct. 15, 2007.

*Steven F. Reiber, et al.* v. *Wester Digital Corp., et al.*, Case No. 2:07 CV-01874-LEW-JFM, "Order Staying Action," Nov. 13, 2007, United States District Court Eastern District of California Sacramento Division.

* cited by examiner

FLIP CHIP BONDING TOOL TIP

CROSS REFERENCE TO RELATED APPLICATIONS

This application is a continuation-in-part and claims the priority benefit of U.S. patent application Ser. No. 10/650,169 filed Aug. 27, 2003, now U.S. Pat. No. 6,935,548, entitled "Dissipative Ceramic Bonding Tool Tip" which is a continuation of U.S. patent application Ser. No. 10/036,579 filed Dec. 31, 2001, now U.S. Pat. No. 6,651,864, entitled "Dissipative Ceramic Bonding Tool Tip" which claims the priority benefit of U.S. provisional patent application No. 60/288,203 filed May 1, 2001, and is also a continuation-in-part of U.S. patent application Ser. No. 09/514,454 filed Feb. 25, 2000, now U.S. Pat. No. 6,354,479 and entitled "Dissipative Ceramic Bonding Tool Tip" which claims the priority benefit of provisional patent application No. 60/121,694 filed Feb. 25, 1999; this application also claims the priority benefit of U.S. provisional patent application No. 60/503,267 filed Sep. 15, 2003 entitled "Bonding Tool." This application is related to co-pending U.S. patent application Ser. No. 10/943,151 filed Sep. 15, 2004 and entitled "Bonding Tool with Resistance." The disclosure of all of these applications is incorporated herein by reference.

BACKGROUND OF THE INVENTION

1. Field of the Invention

This invention relates to flip chip bonding tool tips and, more particularly, to dissipative ceramic flip chip bonding tips for bonding electrical connections.

2. Description of the Prior Art

Integrated circuits have different methods of attachment to a lead frame. One method is an ultrasonic wire bond, both ball and wedge, where individual leads are connected to individual bond pads on the integrated circuit with wire. Wire bonding uses "face-up" chips with a wire connection to each pad. Bump or "flip chip" microelectronic assembly is the direct electrical connection of face-down—"flipped"—electronic components onto substrates, circuit boards, or carriers by means of conductive bumps on the chip bond pads.

Flip chip components are predominantly semiconductor devices. Components such as passive filters, detector arrays, and MEMs devices are also used in flip chip form. Flip chip is sometimes referred to as Direct Chip Attach (DCA) as the chip is attached directly to the substrate, board, or carrier by the conductive bumps. Automotive electronics, electronic watches, and a growing percentage of cellular phones, pagers, and high speed microprocessors are assembled with flip chips.

The bump serves several functions in the flip chip assembly. Electrically, the bump provides the conductive path from chip to substrate. The bump also provides a thermally conductive path to carry heat from the chip to the substrate. In addition, the bump provides part of the mechanical mounting of the die to the substrate. The bump also provides a spacer, preventing electrical contact between the chip and substrate conductors and acting as a short lead to relieve mechanical, strain between board and substrate.

Gold stud bumps are placed on die bond pads through a modification of the "ball bonding" process used in conventional wire bonding. In ball bonding, a tip of a gold bond wire is melted to form a sphere. A wire bonding tool presses this sphere against an aluminum bond pad, applying mechanical force, heat, and ultrasonic energy to create a metallic connection. The wire bonding tool next extends the gold wire to a connection pad on the board, substrate, or lead frame and makes a "stitch" bond to the pad, finishing by breaking off the bond wire to begin another cycle.

For gold stud bumping, the first ball bond is made as described but the wire is then broken close above the ball. The resulting gold ball, or "stud bump" remaining on the bond pad provides a permanent and reliable connection through the aluminum oxide to the underlying metal. After placing the stud bumps on a chip, the stud bumps may be flattened—"coined"—by mechanical pressure to provide a flatter top surface and more uniform bump heights while pressing any remaining wire tail into the ball. Each bump may be coined by a tool immediately after forming, or all bumps on the die may be simultaneously coined by pressure against a flat surface in a separate operation following bumping.

Bonding tool tips must be sufficiently hard to prevent deformation under pressure and mechanically durable so that many bonds can be made before replacement. Typical flip chip bonding tips available on the market today are made of an insulator of zirconia tuffened alumina ($Al_2O_3$)—aluminum oxide—tungsten carbide, or titanium carbide. These insulators are very hard compounds that have been successfully used on commercial machines as these compounds provide a reasonably long life in use as a flip chip bonding tool.

The problem, however, is that an electrostatic discharge from the bonding tool or transient currents from the machine can damage the very circuit the tool is bonding. Flip chip bonding tool tips must be electrically designed to produce a reliable electrical contact, yet prevent electrostatic discharge damage to the part being bonded. Certain prior art devices have a one-or-more volt emission when the tip makes bonding contact. This could present a problem as a one-volt static discharge could generate a 20 milliamp current to flow, which, in certain instances, could cause the integrated circuit to fail due to this unwanted current.

SUMMARY OF THE INVENTION

Electrically, dissipative flip chip bonding tips for bonding electrical connections to bonding pads on electrical devices are disclosed. In accordance with the principles of the present invention, to avoid damaging delicate electronic devices by any electrostatic discharge, a flip chip bonding tool tip must conduct electricity at a rate sufficient to prevent charge buildup but not at so high a rate as to overload the device being bonded. In other words, it is desirable for the bonding tip to discharge slowly. The tip needs to discharge to avoid a sudden surge of current that could damage the part being bonded.

In exemplary embodiments, a resistance in the tip assembly, itself, ranges from $10^2$ to $10^{12}$ ohms. The tools also comprise specific mechanical properties to function satisfactorily. High stiffness and high abrasion resistance requirements have limited possible materials to, for example, ceramics (e.g., electrical non-conductors) or metals like tungsten carbide (e.g., electrical conductors).

In the present invention, flip chip bonding tool tips with the desired electrical conduction can be made with three different configurations. In the first configuration, tools are made from a uniform extrinsic semi-conducting material which has dopant atoms in appropriate concentration and valence states to produce sufficient mobile charge carrier densities—unbound electrons or holes—which will result in electrical conduction in a desired range. Polycrystalline silicon carbide uniformly doped with boron is an example of such a uniform extrinsic semi-conducting material.

In a second configuration, the tools are made by forming a thin layer of a highly doped semi-conductor on an insulating core. In this instance, the core provides mechanical stiffness, while the semi-conductor surface layer provides abrasion resistance and a charge carrier path from tip to mount that will permit dissipation of electrostatic charge at an acceptable rate. A diamond tip wedge that is ion implanted with boron is an example of such a thin layered tool.

In a third configuration, the tools are made by forming a lightly doped semi-conductor layer on a conducting core. The conducting core provides mechanical stiffness, while the semi-conductor layer provides abrasion resistance and a charge carrier path from tip to conducting core, which is electrically connected to the mount. The doping level is chosen to produce conductivity through the layer which will permit dissipation of electrostatic charge at an acceptable rate. A cobalt-bonded tungsten carbide coated with titanium nitride carbide is an example of such a lightly doped tool.

DETAILED DESCRIPTION OF EXEMPLARY EMBODIMENT

Figure 1:
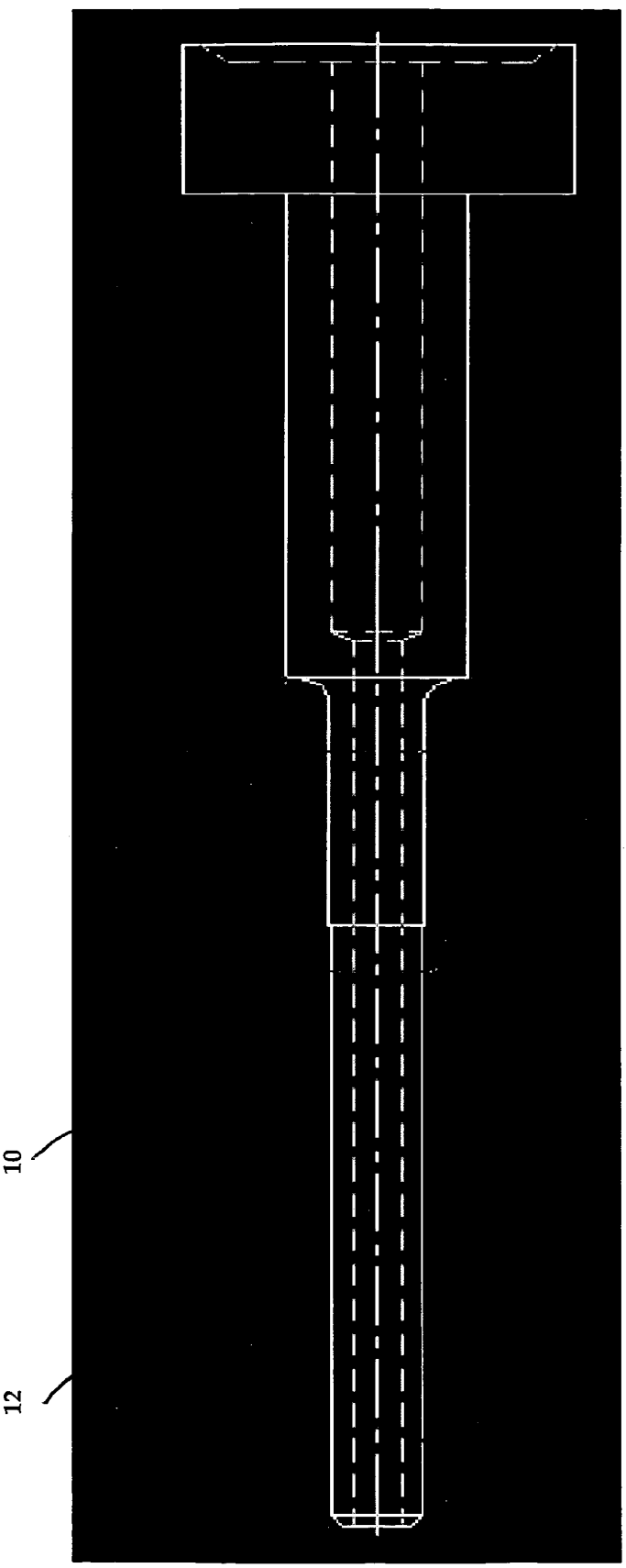
FIG. 1 is a cross-sectional view of a flip chip bonding tool tip.

FIG. 1 illustrates an exemplary flip chip bonding tool 10. The flip chip bonding tool 10 is about two inches (e.g., 30 to 80 mm) long and about 0.124 inch (i.e., 3.0 mm) in diameter. A bonding tool tip 12, itself, is usually 3 to 100 mils (e.g., 0.8 to 2.54 mm) long. Running a length of the flip chip bonding tool 10, but not viewable in FIG. 1, is a tube hole which accommodates a vacuum to pick up the flip chip bonding tool 10.

Figure 2:
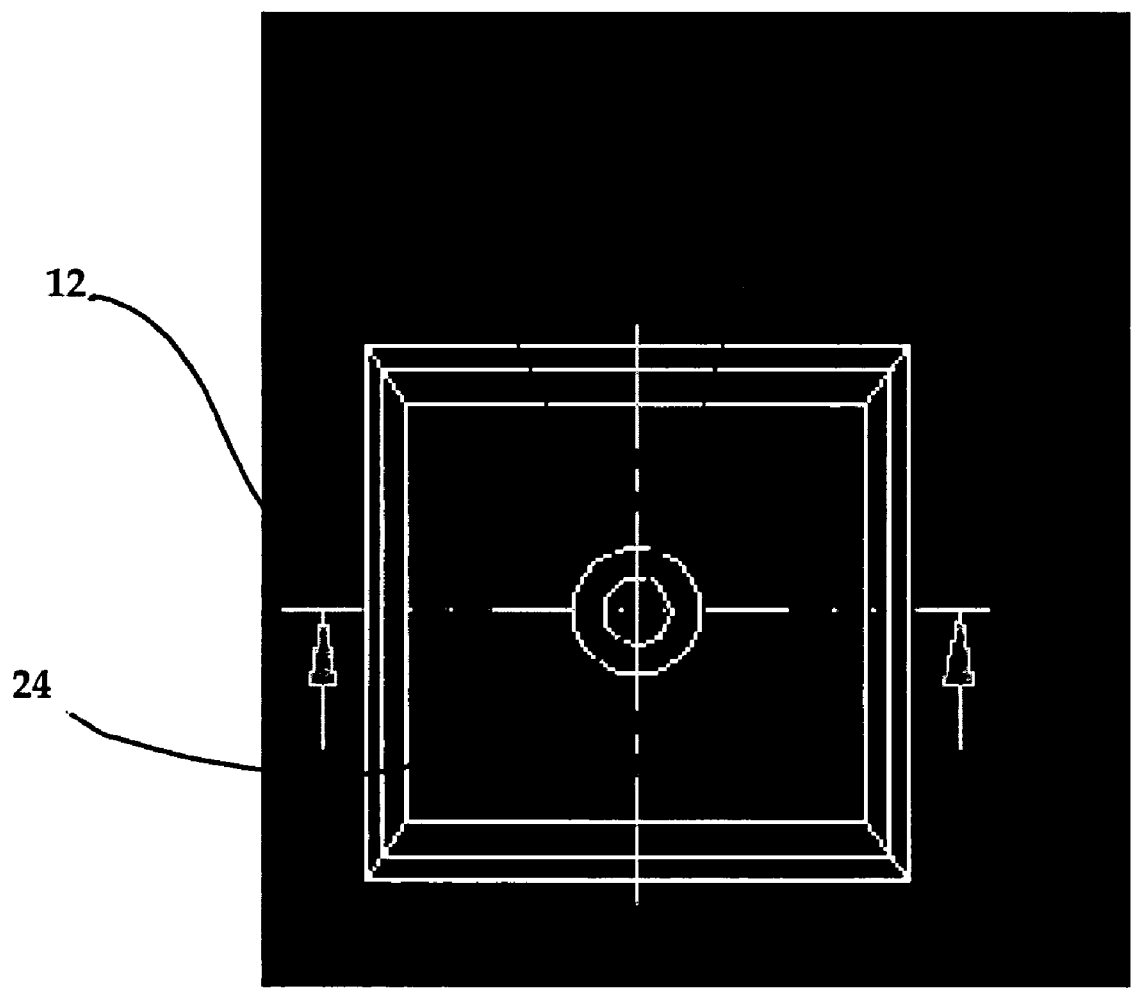
FIG. 2 is an enlarged, cross-sectional view of the flip chip bonding tool of FIG. 1.

FIG. 2 is an enlarged, cross-sectional view of the flip chip bonding tool 10 of FIG. 1. Only that portion of the bonding tool 10 shown within the dotted circle of FIG. 1 is shown in FIG. 2. Tool tip 12 has the tube hole 24, which may run the entire length of bonding tool 10. In a further embodiment, the tool tip 12 comprises grooves.

In accordance with the principles of the present invention, to avoid damaging delicate electronic devices by an electrostatic discharge, the bonding tool tip 12 must conduct electricity at a rate sufficient to prevent charge buildup but not at so high a rate as to overload a device being bonded. In exemplary embodiments, the bonding tool 10 should have electrical conduction greater than one ten-billionth of a mho (i.e., $>1\times10^{-12}$ reciprocal ohms), but the tool's electrical conductivity must be less than one one-hundred thousandth of a mho (i.e., $<1\times10^{-2}$ reciprocal ohms).

Additionally, the tool's resistance should be low enough so that the material of the bonding tool 10 is not an insulator, which does not allow for any dissipation of charge, but high enough so that the material is not a conductor which allows a current flow. In exemplary embodiments, a resistance in the tip assembly should range from $10^2$ to $10^{12}$ ohms. For example, 5 milliamps of current will damage present-day magnetic recording heads. Preferably, for today's magnetic recording heads, no more than 2 to 3 milliamps of current should be allowed to pass through the tool tip 12 to the head.

The bonding tool 10 also has specific mechanical properties to function satisfactorily. High stiffness and high abrasion resistance requirements have limited possible materials, for example, to ceramics (electrical non-conductors) or metal, such as tungsten carbide (electrical conductor). The exemplary tool tip 12 should have a Rockwell hardness of about 55 or above, preferably of about 365 or above. Additionally, the tool tip 12 should be able to last for at least two thousand bonding cycles.

In the present invention, flip chip bonding tool tips with the desired electrical conduction can be made with three different configurations. First, the tools can be made from a uniform extrinsic semi-conducting material which has dopant atoms in appropriate concentration and valence states to produce sufficient mobile charge carrier densities—unbound electrons or holes—which will result in electrical conduction in a desired range. Polycrystalline silicon carbide uniformly doped with boron is an example of such a uniform extrinsic semi-conducting material.

Second, the tools can be made by forming a thin layer of a highly doped semi-conductor on an insulating core. In this instance, the core provides mechanical stiffness while the semi-conductor surface layer provides abrasion resistance and a charge carrier path from tip to mount that will permit dissipation of electrostatic charge at an acceptable rate. A diamond tip wedge that is ion implanted with boron is an example of such a thin layered tool.

Third, the tools can be made by forming a lightly doped semi-conductor layer on a conducting core. The conducting core provides mechanical stiffness while the semi-conductor layer provides abrasion resistance and a charge carrier path from tip to conducting core, which is electrically connected to the mount. A doping level is chosen to produce conductivity through the layer which will permit dissipation of electrostatic charge at an acceptable rate. A cobalt-bonded tungsten carbide coated with titanium nitride carbide is an example of such a lightly doped tool.

Figure 3:
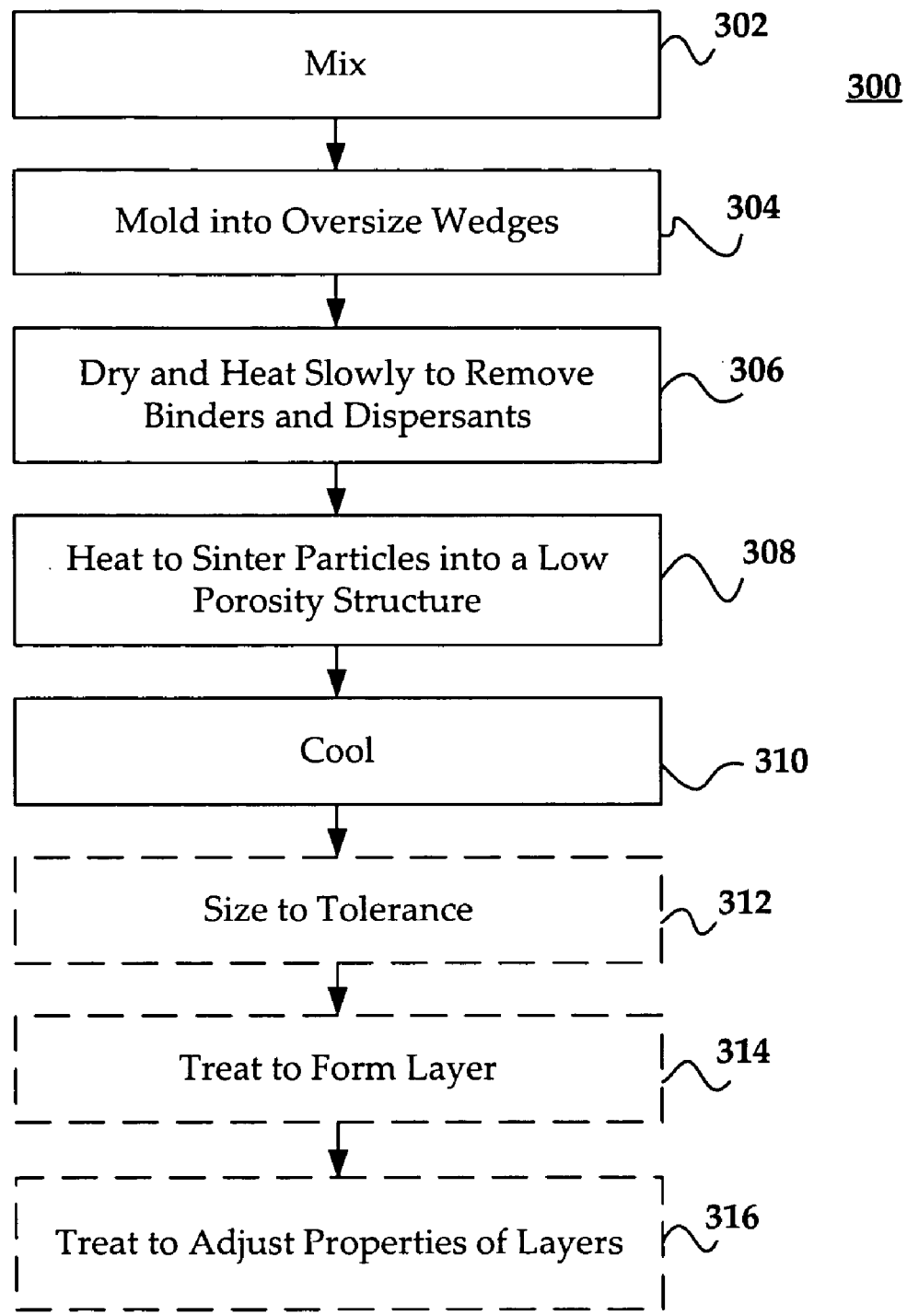
FIG. 3 is an exemplary method for manufacturing a dissipative flip chip bonding tool tip through the use of mixing, molding, and sintering reactive powders.
Figure 4:
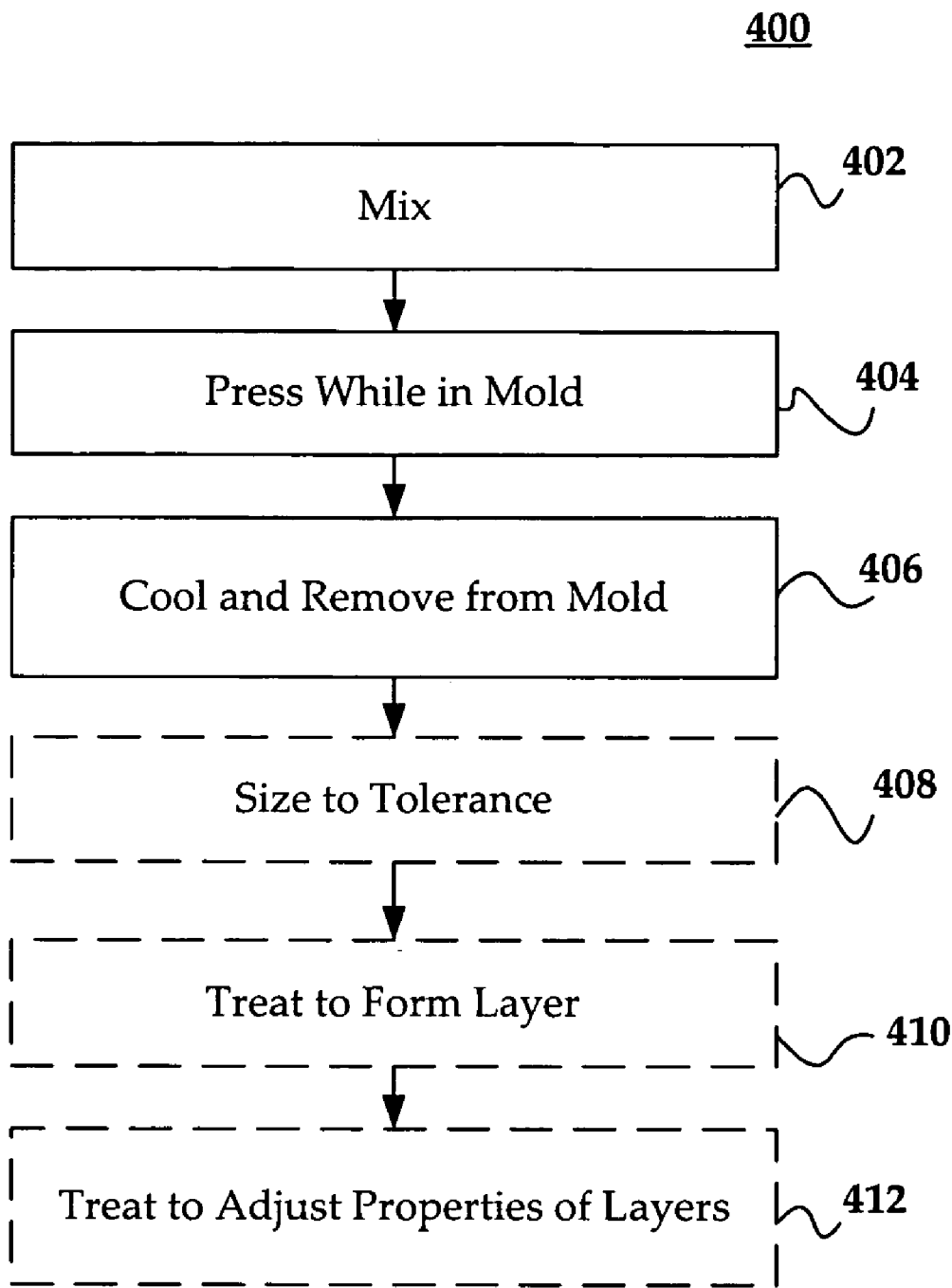
FIG. 4 is an exemplary method for manufacturing a dissipative flip chip bonding tool tip through the use of hot pressing reactive powders.
Figure 5:
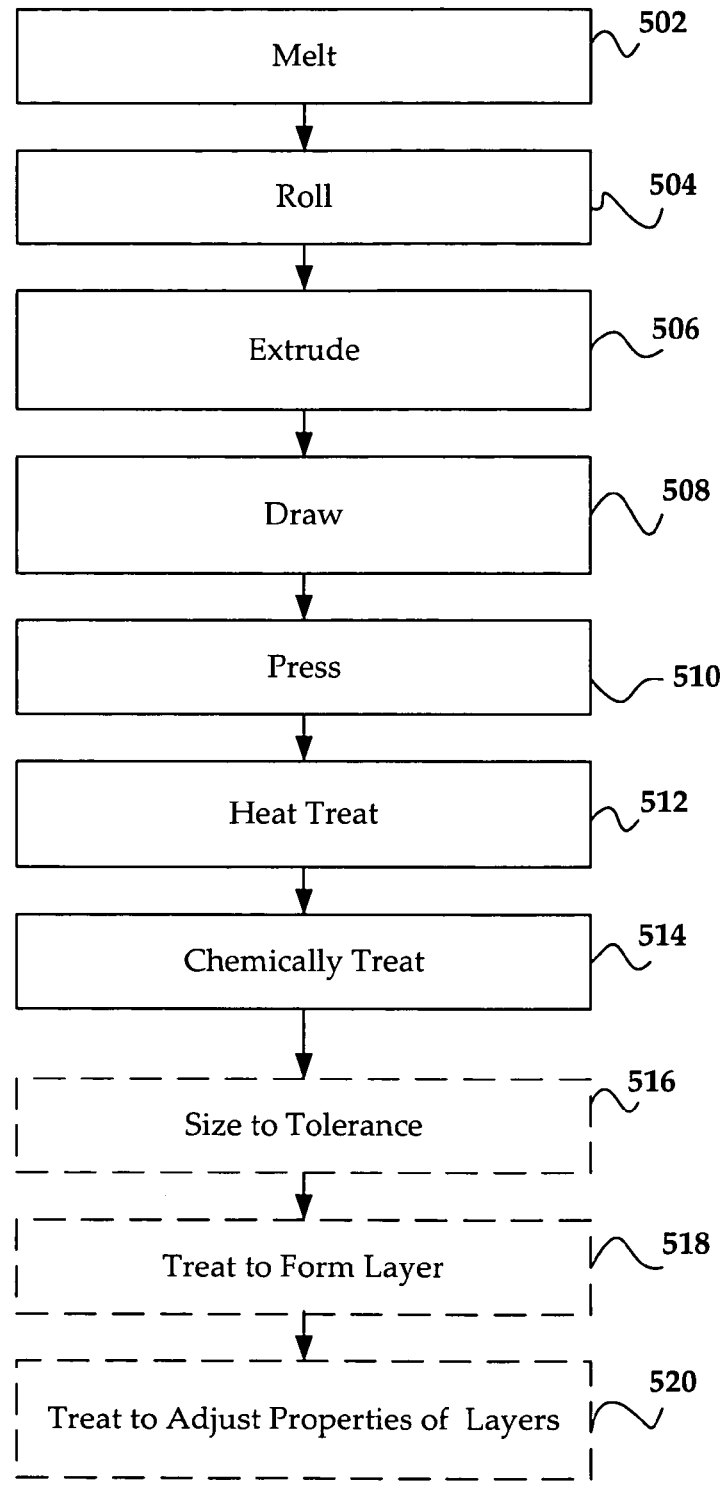
FIG. 5 is an exemplary method for manufacturing a dissipative flip chip bonding tool tip through fusion casting.

Dissipative tools can be manufactured through the use of mixing, molding, and sintering reactive powders as shown in FIG. 3; the use of hot pressing reactive powders as shown in FIG. 4; and through fusion casting as shown in FIG. 5.

Referring now to FIG. 3, an exemplary flowchart 300 for manufacturing dissipative flip chip bonding tools is shown. Through the use of mixing, molding, and sintering reactive powders—for example, alumina ($Al_2O_3$), zirconia ($Zr_2O_3$), iron oxide ($FeO_2$), or titanium oxide ($Ti_2O_3$)—fine particles (e.g., a half of a micron in size) of a desired composition are mixed 302 with organic and inorganic solvents, dispersants, binders, and sintering aids. The binder and/or the sintering aids could be any of, any combination of, or all of magnesia, yttria, boron, carbon colloidal silica, alumina solvents, ethyl silicate, any phosphate, any rare earth metal oxide, or yttrium. Solvents, too, could be any of the aforementioned elements, compounds, or combination in addition to $H_2O$, for example.

The mixture is then molded 304 into oversized wedges. The wedges are carefully dried and slowly heated 306 to remove the binders and dispersants. In one embodiment, the wedges are heated to a temperature between 500–2500 degrees Celsius. The wedges are then heated to a high enough temperature so that the individual particles sinter together 308 into a solid structure with low porosity. In one embodiment, the wedges are heated to at least a temperature of 4000 degrees Celsius. The heat-treating atmosphere is chosen to facilitate the removal of the binder at a low temperature and to control the valence of the dopant atoms at the higher temperature and while cooling 310. After cooling 310, the wedges may be machined 312 to achieve required tolerances.

The wedges may then be treated 314 to produce a desired surface layer (e.g., 100 to 1000 Angstroms thick) by ion implementation, vapor deposition, chemical vapor deposition, physical deposition, electro-plating deposition, neutron bombardment, or combinations of the above. The pieces may be subsequently heat treated 316 in a controlled atmosphere (e.g., 2000 to 2500 degrees Celsius for 3 to 5 minutes) to produce desired layer properties through diffusion, re-crystallization, dopant activation, or valence changes of metallic ions.

Referring now to FIG. 4, an exemplary flowchart 400 for manufacturing dissipative flip chip bonding tools using hot pressing reactive powders is shown. Through the use of hot pressing reactive powders—like those disclosed above—fine particles of a desired composition are mixed 402 with binders and sintering aids, like those disclosed above. The mixture is then pressed 404 in a mold at a high enough temperature (e.g., 1000 to 4000 degrees Celsius) to cause consolidation and binding of the individual particles into a solid structure with low porosity (e.g., having grain size of less than half a micron in size). In one embodiment, the temperature is between 1000 and 2500 degrees Celsius. The hot pressing atmosphere is chosen to control the valence of the dopant atoms.

After cooling and removal 406 from the hot press, the pieces may be machined 408 to achieve required tolerances. The pieces may then be treated 410 to produce a desired surface layer by ion implementation, vapor deposition, chemical vapor deposition, physical deposition, electo-plating deposition, neutron bombardment, or combinations of the above. The pieces may subsequently be heat treated 412 in a controlled atmosphere to produce desired layer properties through diffusion, re-crystallization, dopant activation, or valence changes of metallic ions.

Referring now to FIG. 5, an exemplary flowchart 500 for manufacturing dissipative flip chip bonding tools using fusion casting is shown. Through fusion casting, metals of a desired composition are melted 502 in a non-reactive crucible before being cast into an ingot. The ingot is then rolled 504, extruded 506, drawn 508, pressed 510, heat-treated 512 in a suitable atmosphere, and chemically treated 514. The rolling 504, extruding 506, drawing 508, and pressing 510 steps shape the tip and the heat treatment 512 and chemical treatment 514 steps are for affecting or imparting mechanical and electrical properties such as hardness and resistivity.

The pieces may then be machined 516 to achieve required tolerances. The metallic pieces may also be treated to produce a desired surface layer 518 by vapor deposition, chemical vapor deposition, physical deposition, electroplating deposition, or combinations of the above. The pieces may subsequently be heat-treated (e.g., 4000 degrees Celsius for three to four hours) in a controlled atmosphere to produce desired layer properties 520 through diffusion, re-crystallization, dopant activation, or valence changes of metallic ions.

The present invention further provides that the layer used in the bonding process may be the following composition of matter; for example, a formula for dissipated ceramic comprising alumina (aluminum oxide $Al_2O_3$) and zirconia (zirconium oxide $ZrO_2$) and other elements. This mixture is both somewhat electrically conductive and mechanically durable. The tip of a bonding tool will be coated with this material or it can be made completely out of this material. The shape of the tip may be wedge or circular shaped.

The bonding tip of the present invention can be used for any number of different types of bonding. Two examples are ultrasonic and thermal flip chip bonding.

While the present invention has been described with reference to embodiments, it will be understood by those skilled in the art that various changes may be made and equivalents may be substituted for elements thereof without departing from the true spirit and scope of the present invention. In addition, modifications may be made without departing from the essential teachings of the present invention.

What is claimed is:

1. A flip chip bonding tool tip for use in flip chip bonding machines for connecting leads on integrated circuit banding pads, the flip chip bonding tool tip comprising a dissipative material, wherein the dissipative material has a resistance low enough to prevent a discharge of a charge to a device being bonded and high enough to avoid current flow large enough to damage the device being bonded, wherein the dissipative material comprises a doped semi-conductor formed in a conducting core and the conducting core comprises a cobalt-bonded tungsten carbide coated with titanium nitride carbide.

2. The flip chip bonding tool tip of claim 1, wherein the dissipative material comprises a resistance in a range of $10^2$ to $10^{12}$ ohms.

3. The flip chip bonding tool tip of claim 1, wherein the flip chip bonding tool tip comprises a tube for vacuum.

4. The flip chip bonding tool tip of claim 1, wherein the flip chip bonding tool tip comprises grooves.

5. The flip chip bonding tool tip of claim 1, wherein the flip chip bonding tool tip comprises a high enough stiffness to resist bending when hot.

6. The flip chip bonding tool tip of claim 1, wherein the dissipative material has dopant atoms in an appropriate concentration and valence states to produce the resistance.

7. A method of manufacturing a dissipative material for use in a flip chip bonding tool tip, wherein the dissipative material has a resistance low enough to prevent a discharge of a charge to a device being bonded and high enough to avoid current flow large enough to damage the device being bonded comprising:

mixing particles of a composition appropriate for forming the dissipative material with solvents, dispersants, binders, and sintering aids to form a mixture;

molding the mixture into at least one wedge;

drying the at least one wedge;

heating the dried at least one wedge to a temperature sufficient to remove the dispersants and binders;

further heating the heated at least one wedge to a temperature to sinter the particles together into a solid structure with low porosity; and cooling the solid structure.

8. The method of claim 7 further comprising machining the cooled solid structure to a required size, shape, or tolerance.

9. The method of claim 7, wherein heating the dried at least one wedge to remove dispersants and binders occurs at a temperature of 500–2500 degrees Celsius.

10. The method of claim 7, wherein further heating the heated at least one wedge is heated to sinter the particles together into a solid structure with low porosity occurs at a temperature of at least 4000 degrees Celsius.

11. The method of claim 7 wherein the binders are selected from the group consisting of magnesia, yttria, boron, carbon colloidal silica, alumina solvent, ethyl silicate, phosphate, yttrium, or a rare earth metal oxide.

12. The method of claim 7 wherein the solvents are selected from the group consisting of magnesia, ytrria, boron, carbon colloidal silica, alumina solvent ethyl silicate, phosphate, ytrria, or a rare earth metal oxide.

13. The method of claim 7 further comprising treating the cooled solid structure to produce a desired surface layer.

14. The method of claim 13 wherein treating the cooled solid structure to produce a desired surface layer comprises ion implementation.

15. The method of claim 13 wherein treating the cooled solid structure to produce a desired surface layer comprises vapor deposition.

16. The method of claim 13 wherein treating the cooled solid structure to produce a desired surface layer comprises chemical vapor deposition.

17. The method of claim 13 wherein treating the cooled solid structure to produce a desired surface layer comprises physical deposition.

18. The method of claim 13 wherein treating the cooled solid structure to produce a desired surface layer comprises electro-plating deposition.

19. The method claim 13 wherein healing the cooled solid structure to produce a desired surface layer comprises neutron bombardment.

20. The method of claim 7 further comprising heat treatment of the cooled solid structure in a controlled atmosphere to produce at least one desired layer property.

21. The method of claim 20 wherein heat treatment of the cooled solid structure in a controlled atmosphere to produce at least one desired layer property comprises diffusion.

22. The method of claim 20 wherein heat treatment of the cooled solid structure in a controlled atmosphere to produce at least one desired layer property comprises re-crystallization.

23. The method of claim 20 wherein heat treatment of the cooled solid structure in a controlled atmosphere to produce at least one desired layer property comprises dopant activation.

24. The method of claim 20 wherein heat treatment of the cooled solid structure in a controlled atmosphere to produce at least one desired layer property comprises valence changes of metallic ions.

25. A method of manufacturing a dissipative material for use in a flip chip bonding tool tip, wherein the dissipative material has a resistance low enough to prevent a discharge of a charge to a device being bonded and high enough to avoid current flow large enough to damage the device being bonded comprising:
    mixing particles of a composition appropriate for forming the dissipative material with binders and sintering aids to form a mixture;
    pressing the mixture in a mold at a high enough temperature to cause consolidation and binding of the particles into a solid structure with low porosity; and
    removing the solid structure from the mold.

26. The method of claim 25, further comprising machining the solid structure to a required size, shape, or tolerance.

27. The method of claim 25, wherein pressing the mixture in a mold occurs as a temperature between 1000 and 2500 degrees Celsius.

28. The method of claim 25 wherein the binders reselected from the group consisting of magnesia, yttria, boron, carbon colloidal silica, alumina solvent, ethyl silicate, phosphate, yttrium, or a rare earth metal oxide.

29. The method of claim 25 further comprising treating the solid structure to produce a desired surface layer.

30. The method of claim 29 wherein treating the solid structure to produce a desired surface layer comprises ion implementation.

31. The method of claim 29 wherein treating the solid structure to produce a desired surface layer comprises vapor deposition.

32. The method of claim 29 wherein treating the solid structure to produce a desired surface layer comprises chemical vapor deposition.

33. The method of claim 29 wherein treating the solid structure to produce a desired surface layer comprises physical deposition.

34. The method of claim 29 wherein treating the solid structure to produce a desired surface layer comprises electro-plating deposition.

35. The method of claim 29 wherein treating the solid structure to produce a desired surface layer comprises neutron bombardment.

36. The method of claim 35 further comprising heat treatment of the solid structure in a controlled atmosphere to produce at least one desired layer property.

37. The method of claim 36 wherein heat treatment of the solid structure in a controlled atmosphere to produce at least one desired layer property comprises diffusion.

38. The method of claim 36 wherein heat treatment of the solid structure in a controlled atmosphere to produce at least one desired layer property comprises re-crystallization.

39. The method of claim 36 wherein heat treatment of the solid structure in a controlled atmosphere to produce at least one desired layer property comprises dopant activation.

40. The method of claim 36 wherein heat treatment of the solid structure in a controlled atmosphere to produce at least one desired layer property comprises valence changes of metallic ions.

41. A method of manufacturing a dissipative material for use in a flip chip bonding tool tip, wherein the dissipative material has a resistance low enough to prevent a discharge of a charge to a device being bonded and high enough to avoid current flow large enough to damage the device being bonded comprising:
    melting at least one metal of a composition appropriate for forming the dissipative material in a non-reactive crucible;
    casting the melted at least one metal into an ingot;
    rolling the ingot into a rolled ingot;
    extruding the rolled ingot into an extruded material;
    drawing the extruded material into a drawn material; and
    pressing the drawn material into a pressed material.

42. The method of claim 41, further comprising machining the pressed material to a required size, shape, or tolerance.

43. The method of claim 41 further comprising treating the pressed material to produce a desired surface layer.

44. The method of claim 43 wherein treating the pressed material to produce a desired surface layer comprises vapor deposition.

45. The method of claim 43 wherein treating the pressed material to produce a desired surface layer comprises chemical vapor deposition.

46. The method of claim 43 wherein treating the pressed material to produce a desired surface layer comprises physical deposition.

47. The method of claim 43 wherein treating the pressed material to produce a desired surface layer comprises electro-plating deposition.

48. The method of claim 41 further comprising heat treatment of the pressed material in a controlled atmosphere to produce at least one desired layer property.

49. The method of claim 48 wherein heat treatment of the pressed material in a controlled atmosphere to produce at least one desired layer property comprises diffusion.

50. The method of claim 48 wherein heat treatment of the pressed material in a controlled atmosphere to produce at least one desired layer property comprises re-crystallization.

51. The method of claim 48 wherein heat treatment of the pressed material in a controlled atmosphere to produce at least one desired layer property comprises dopant activation.

52. The method of claim 48 wherein heat treatment of the pressed material in a controlled atmosphere to produce at least one desired layer property comprises valence changes of metallic ions.

53. A method for using a flip chip bonding tool in microelectronic assembly, comprising:
providing a flip chip bonding machine capable of being equipped with a flip chip bonding tool;
equipping the flip chip bonding machine with the flip chip bonding tool, wherein the flip chip bonding tool has a tip comprised of a dissipative material wherein the dissipative material has a resistance low enough to prevent a discharge of a charge to a device being bonded and high enough to avoid current flow large enough to damage the device being bonded;
providing a bonding material that is thermally and electrically conductive;
melting the bonding material so that it becomes substantially spherical in shape; and
electrically connecting an at least one component to a substrate by means of the flip chip bonding tool tip pressing the substantially spherical-shaped bonding material against a chip bond pad, wherein the substantially spherical bonding material is pressed to form a conductive bump.

54. The method of claim 53 further comprising coining the conductive bump.

55. A method of using an electricaLy dissipative flip chip bonding tool lip, having a resistance in the range of $10^2$ to $10^{12}$ ohms, comprising: providing the electrically dissipatite flip chip bonding tool tip; bonding a material to a device; establishing a potential between the electrically dissipative flip chip bonding tool
tip and the device being bonded, wherein establishing the potential between the electrically dissipative flip chip bonding tool tip and the device being bonded comprises grounding leads on the device being bonded; and
allowing an essentially smooth curient to dissipate to the device, the current being low enough so as not to damage the device being bonded and high enough to avoid a build up of charge that could discharge to the device being bonded and damage the device being bonded.

56. A method of using an electrically dissipative flip chip bonding tool tip, having a resistance in the range of $10^2$ to $10^{12}$ ohms, comprising:
providing the electrically dissipative flip chip bonding tool tip;
placing the electrically dissipative flip chip bonding tool tip in electrical
contact with a device being bonded, wherein wire is fed through a tubular channel in the electrically dissipative flip chip bonding tool tip prior to the electrically dissipative flip chip bonding tool tip having been placed in contact with the device being bonded;
bonding a material to the device; and
allowing an essentially smooth current to dissipate to the device, the
current being low enough sc as not to damage the device being bonded and high enough to avoid a build up of charge that could discharge to the device being bonded and damage the device being bonded.

57. A method of using an electricaLy dissipative flip chip bonding tool tip, having a resistance in the range of $10^2$ to $10^{12}$ ohms, comprising:
providing the electrically dissipative flip chip bonding tool tip;
providing an electrical discharge al the electrically dissipative flip chip bonding
tool tip to melt a bit of wire,
forming the bit of wire into a bonding ball;
bonding a material to a device using the bonding ball; and
allowing an essentially smooth current to dissipate to the device, the current
being low enough so as not to damage the device being bonded and high enough to avoid a build up of charge that could discharge to the device being bonded and damage the device being bonded.

58. The method of claim 57 further comprising causing the bonding ball to make intimate contact with the device, thereby initiating dissipation of charge.

59. The method of claim 57 further comprising moving the electrically dissipative flip chip bonding tool tip from the device, with the wire being fed as the electrically dissipative flip chip bonding tool tip moves onto a different point of the device.

* * * * *